United States Patent
Berkenbush et al.

(10) Patent No.: US 9,312,526 B1
(45) Date of Patent: Apr. 12, 2016

(54) BATTERY MOUNT FOR SHIELDED MILITARY ENVIRONMENTS

(71) Applicant: BAE SYSTEMS Information and Electronic Systems Integration Inc., Nashua, NH (US)

(72) Inventors: Richard E. Berkenbush, Pompton Plains, NJ (US); Edward D. O'Neill, Totowa, NJ (US); Christopher Errick, West Milford, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 200 days.

(21) Appl. No.: 13/712,152

(22) Filed: Dec. 12, 2012

Related U.S. Application Data

(60) Provisional application No. 61/630,599, filed on Dec. 14, 2011.

(51) Int. Cl.
*H01M 2/10* (2006.01)
*H05K 13/00* (2006.01)

(52) U.S. Cl.
CPC ............. *H01M 2/1094* (2013.01); *H05K 13/00* (2013.01); *H01M 2/10* (2013.01); *H01M 2/1005* (2013.01); *H01M 2/105* (2013.01); *H01M 2/1022* (2013.01); *H01M 2/1044* (2013.01); *H01M 2/1055* (2013.01); *H01M 2/1061* (2013.01); *H01M 2/1066* (2013.01)

(58) Field of Classification Search
CPC ... H01M 2/10; H01M 2/1005; H01M 2/1022; H01M 2/1044; H01M 2/105; H01M 2/1061; H01M 2/1066; H01M 2/1094; H01M 2/12; H01M 2/204; H01M 2/30; H01M 2/34; H01M 2200/00; H01M 2/1055; Y02E 60/12
USPC ................... 429/96, 100, 163, 167, 168, 170; 29/623.1–623.5
See application file for complete search history.

(56) References Cited

U.S. PATENT DOCUMENTS

| | | | | |
|---|---|---|---|---|
| 5,943,174 A | * | 8/1999 | Bryant | G02B 23/12 250/214 VT |
| 6,463,159 B1 | * | 10/2002 | Ming-Cheng | 381/355 |
| 2004/0151963 A1 | * | 8/2004 | Buchanan et al. | 429/34 |

* cited by examiner

*Primary Examiner* — Jonathan Jelsma
*Assistant Examiner* — Omar Kekia
(74) *Attorney, Agent, or Firm* — Sand & Sebolt; Clay H. Cunningham; Daniel J. Long

(57) ABSTRACT

A system and method for installing a battery in an electronics module is presented. A battery mount includes an elongated battery can with first and second ends and receives a battery through the second end. An insulating sleeve with first and second ends is fitted around the first end of the battery can. A metallic cap is placed over the first end of the insulating sleeve and around a portion of the insulating sleeve. A non-conductive housing is mounted in the electronics module to receive the battery can and the battery. The metallic cap is attached to a front panel of the electronics module when the battery can and the battery are inserted into the housing. The insulating sleeve and non-conductive housing isolates terminals of the battery from a surface of the electronics module and the metallic cap provides for electromagnetic interference shielding of the battery.

22 Claims, 5 Drawing Sheets

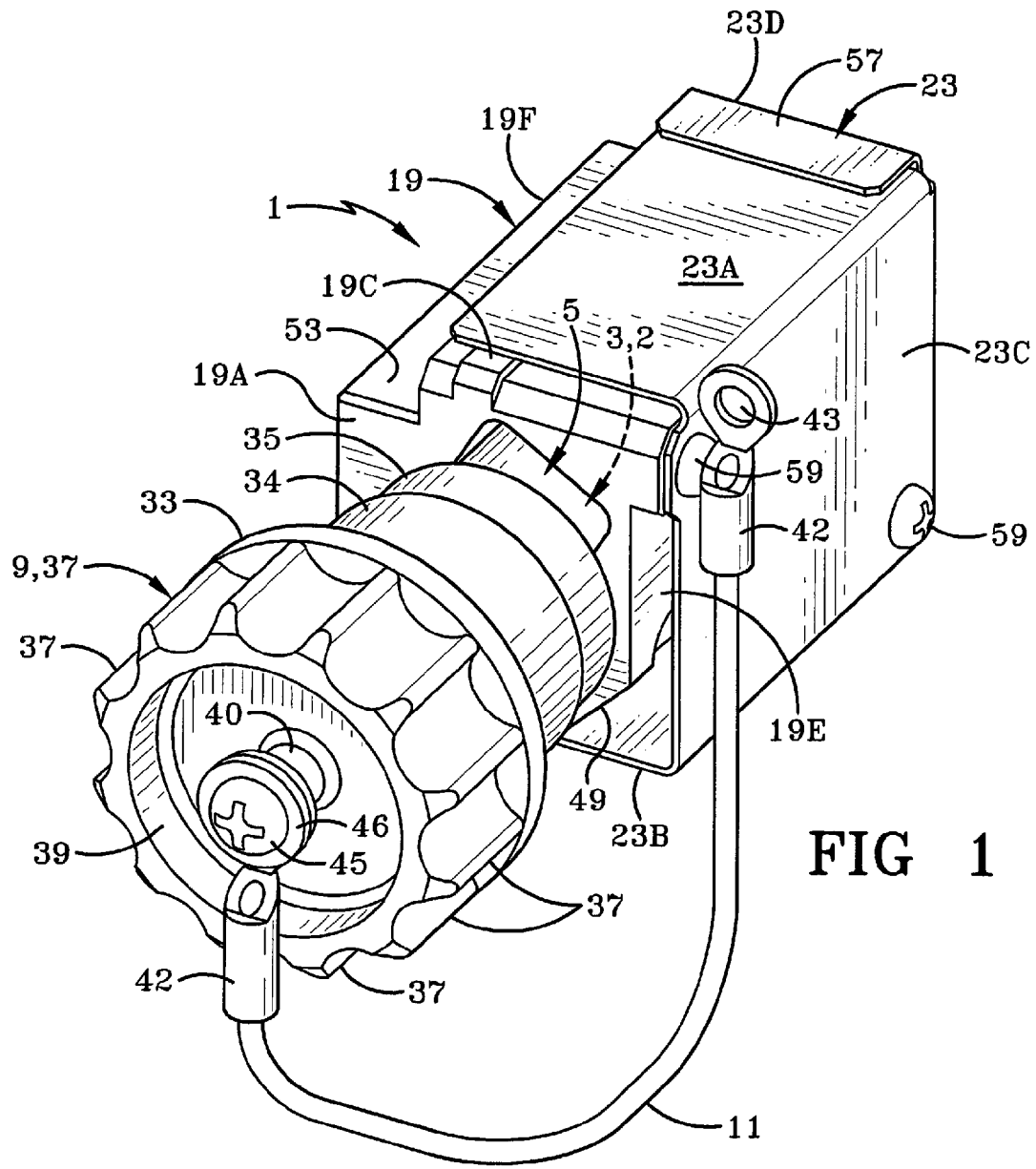
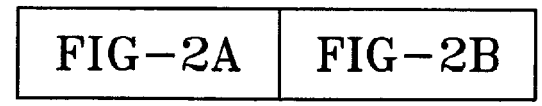
FIG 2

BATTERY MOUNT FOR SHIELDED MILITARY ENVIRONMENTS

CROSS REFERENCE TO RELATED APPLICATION

This application claims priority from U.S. Provisional Application Ser. No. 61/630,599 filed Dec. 14, 2011; the disclosure of which is incorporated herein by reference.

BACKGROUND OF THE INVENTION

1. Field of Invention

The current invention relates generally to apparatus, systems and methods for mounting a battery. More particularly, the apparatus, systems and methods relate to a battery mount that is located on the front panel of electronic equipment. Specifically, the apparatus, systems and methods provide for a battery mount that is insulated from an electronic chassis ground and that has an insulated battery mount cap.

2. Description of Related Art

Available accessible space on front panels of military electronics has been decreasing with the shrinking of electronics so that competition for front panel space for connectors, indicators, switches, handles, etc. is increasingly challenging. Past techniques included removing battery cover screws, removing the cover, removing an old battery from a battery holder, installing the battery into a battery holder, replacing the battery holder with the new battery back into the electronic equipment and reattaching the cover with the screws. These old techniques now require more space than is typically available. A need, therefore, exists for a compact and improved battery mount.

SUMMARY

The preferred embodiment includes an isolated battery mount which isolates the positive and negative terminals of the battery from the chassis mounting surfaces. An insulated cap, which provides electromagnetic interference (EMI) shielding and a moisture seal to the enclosure when fully seated. Front panel space requirements are minimized allowing more space for other requirements. Simple 'no tools' access is also achieved with or without protective gloves.

The preferred embodiment of the invention includes a battery mount. The battery mount includes an elongated battery with first and second ends. The battery can receive a battery through its second end. An insulating sleeve with first and second ends is fitted around at least the first end of the battery can. A metallic cap is located at the first end of the insulating sleeve. A non-conductive housing is mounted in the electronics module to receive the battery can and the battery. The metallic cap is removably attached to a front panel of the electronics module when the battery can and the battery are inserted into the housing. The insulating sleeve and non-conductive housing isolates terminals of the battery from surfaces of the electronics module and the metallic cap provides for electromagnetic interference shielding of the battery.

Another configuration of the preferred embodiment is a method of installing a battery in a military electronics module mounted in a military electronic chassis. The method begins by removing a battery holder assembly from a battery housing assembly that is mounted in the electronics module and then removing an old battery from the battery holder assembly. Next, the method places the battery in an elongated metallic can portion of the battery holder assembly. The metallic can is at least partially surrounded by an insulator sleeve that electrically isolates battery terminals of the battery from a ground of the electronic chassis.

The method now begins to reinstall the battery holder assembly by pushing the battery holder assembly through an opening in a front panel of the military electronics module. A metallic cap connected to the insulator sleeve can then be attached to the front panel of the military electronics module. For example, the metallic cap can be rotated to screw it onto a connector located on the front panel of the military electronics module. Optionally, an O-ring can be placed between the metallic connector and the front panel of the military electronics module to provide for a water tight connection. The metallic cap provides EMI shielding to the military electronics module. This method can be performed without using any tools and can be performed while wearing or not wearing gloves.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the Figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 1 illustrates a preferred embodiment of a battery mount that isolates battery terminals mounted in it from chassis ground and also provides electromagnetic interference (EMI) shielding.

DETAILED DESCRIPTION

Figure 2A:
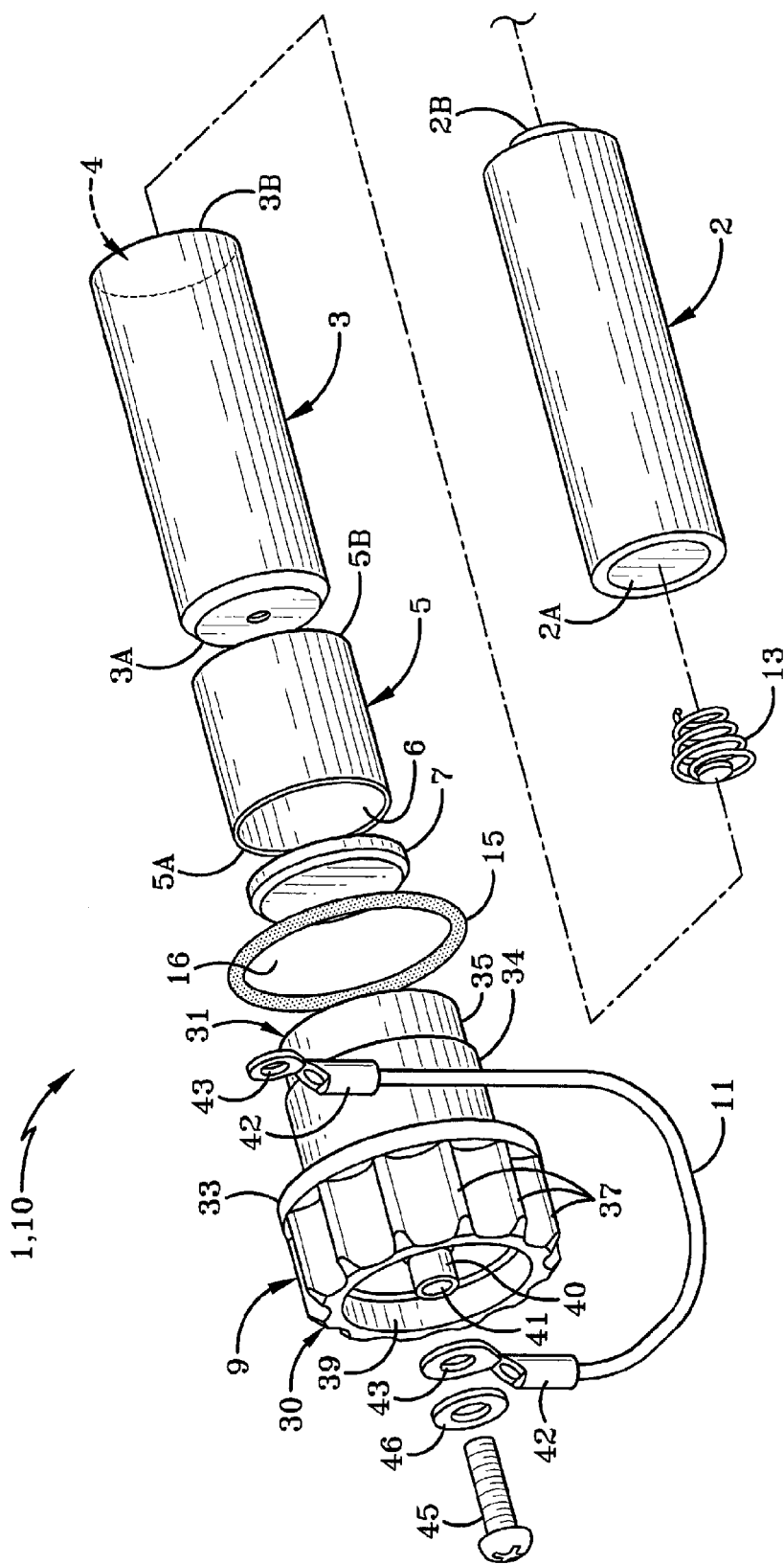
FIG. 2A illustrates an example exploded view of a battery holder assembly of the battery mount.
Figure 3:
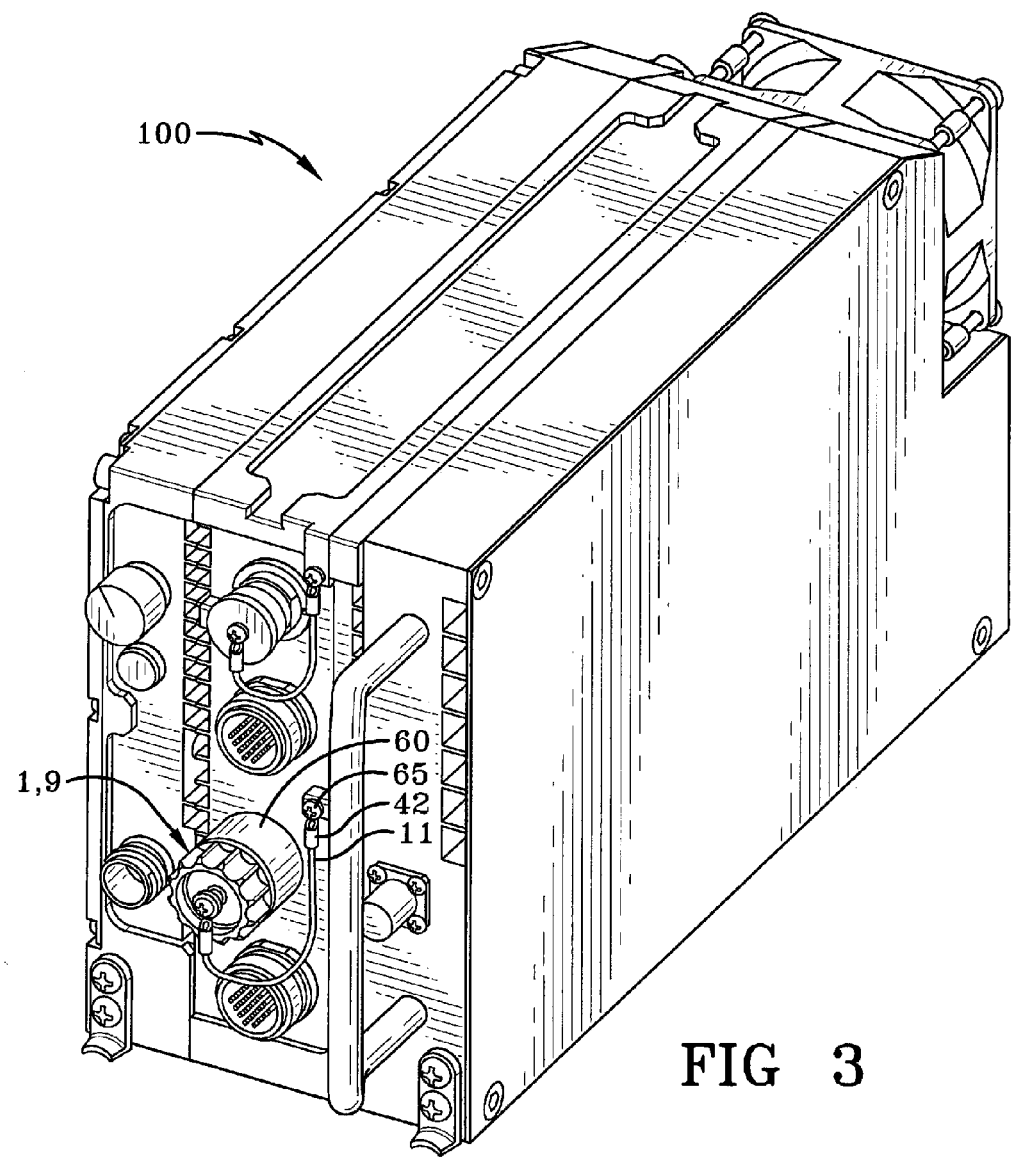
FIG. 3 illustrates and example view of the battery mount installed in an electronic module

FIGS. 1 and 2A/B illustrate the preferred embodiment of a battery mount 1 that includes a battery holder assembly 10 (FIG. 1) and a battery housing assembly 20. The battery holder assembly 10 is removable from an electronics module 100 and the battery holder assembly contains the battery 2. The battery housing assembly 20 would be mounted inside the electronics module. This type of battery mount 1 can be used with electronics modules that may be military electronics modules that are connected to a standard military electronic chassis; however, it can be used in other devices. FIG. 3 illustrates the battery mount 1 installed in an electronic module. In this example figure that battery holder assembly is illustrated as having been screwed into a battery mount protrusion 60 that extends outward from the front of an electronic module as shown in FIG. 3.

The battery holder assembly 10 includes an elongated battery can 3 with a first end 3A and second end 3B. A battery 2 can be inserted into the battery can 3 through an opening 4 in the second end 3B. In the preferred embodiment, the battery can 3 is cylindrical in shape and is formed out of metal. For example, the battery can 3 can be formed out of brass and be nickel plated. An insulating sleeve 5 with a first end 5A and a second 5B end is wrapped around the first end 3A of the battery can 3. The insulating sleeve 5 has an opening 6 passing through it. When the battery can 3 is cylindrical in shape, the insulating sleeve 5 can also be a cylinder that wraps around at least a portion of the battery can 3. An insulation disc 7 can be attached to the first end of the insulating sleeve and in other embodiments the insulating disc can be formed with the insulating sleeve as a single component. The disc 7 acts to insulate a metallic cap 9 from the rest of the battery can 3. In the preferred embodiment, the metallic cap 9 is a machined brass cap that is tin plated and the insulating sleeve 5 and disc 7 are formed out of plastic.

In more detail, the metallic cap 9 has a front end 30 and a back end 31. It is formed with a front portion 33, a central portion 34 and a rear portion 35. The central portion 34 is cylindrical in shape as is the rear portion. However, the rear portion 35 has a smaller outside diameter than the central portion. The front portion 33 is formed with protruding ridges 37 that makes it easy to grip and rotate the battery holder assembly 10 when it is removed or installed into the battery housing assembly 20. The areas between adjacent ridges 37 are concave in shape. The front portion 33 has a recessed area 39 with protrusion 40 extending forward from the recessed area 39. The protrusion 40 has an opening 41 that extends partially into the front portion 33.

The battery holder assembly 10 can include other components and features. For example, the battery can 3 can have a contact spring 13 riveted inside it at is first end 3A. An O-ring 15 can be mounted to the metallic cap 9 to provide a watertight fitting between the metallic cap 9 and a front side of the electronics module. The O-ring 15 has an opening passing through it. In some configurations, the metallic cap 9 can have threads formed on it so that it can be screwed onto complementary threads formed on the front side of the electronics module. A lanyard 11 can be attached to the metallic lid 9 and attached to the electronics module so that when the battery holder assembly 10 is removed from the electronics module, it is not easily lost because it is tethered to the electronics module to prevent its loss. The lanyard has terminal lugs 42 located at each of its ends with holes 43 extending through each terminal lug 42. One terminal lug 42 is attached to the central protrusion 40 of the central portion 34 of the metallic cap with a screw 45. A washer 46 can be used between the screw and the terminal lug 42. The other end of the lanyard 10, with its terminal lug, is connected with a screw 65 to the electronic module that the battery holder is used in. In general, all the components of the battery holder assembly 10 are attached together to form a single unit that is easily slid into the electronics module.

Figure 2B:
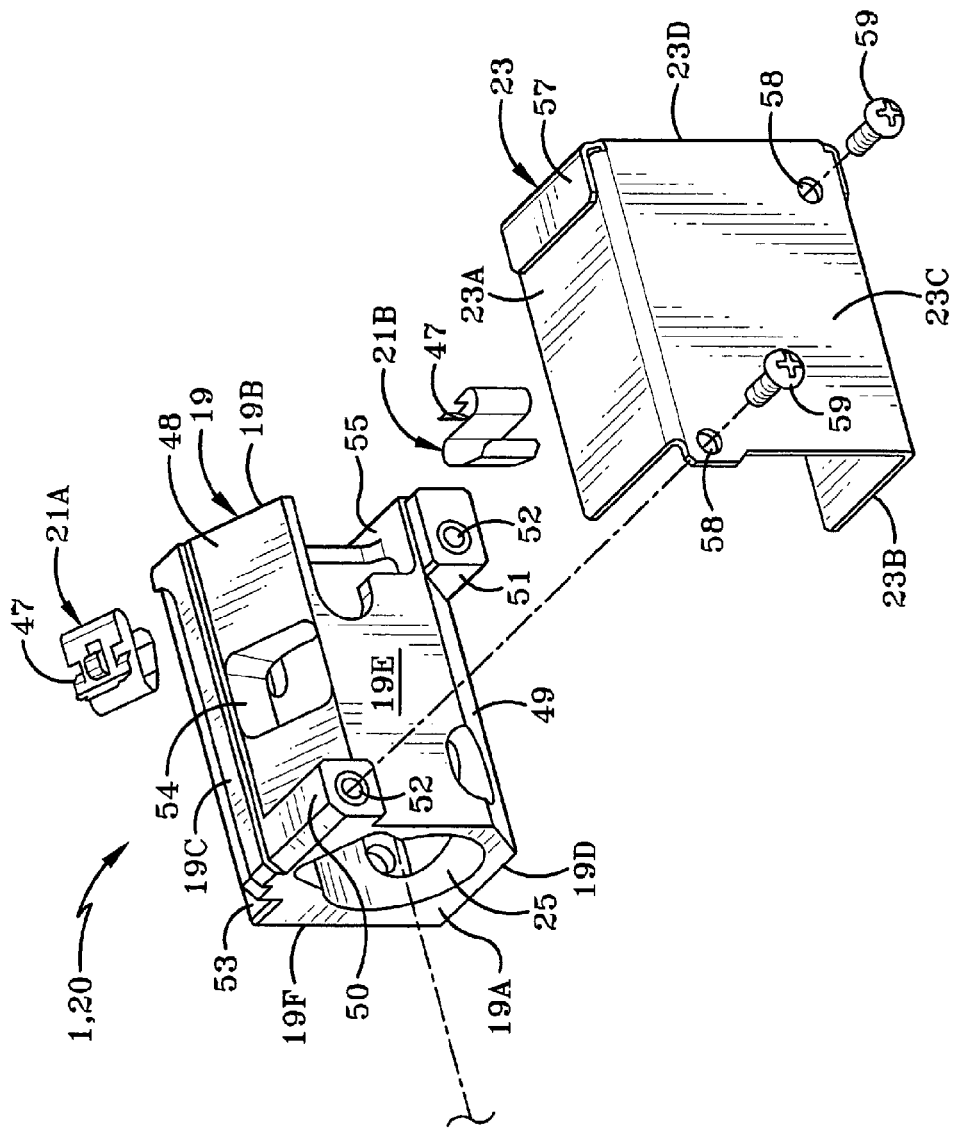
FIG. 2B illustrates an example exploded view of a battery housing assembly of the battery mount.

FIG. 2B best illustrates some of the details of the battery housing assembly 20 that is mounted inside the electronics module. This assembly includes a non-conducting housing 19 that has an opening 25 into which the battery 2 in its battery holder assembly 10 is inserted. The battery housing assembly 19 has a front side 19A, a back side 19B, top side 19C, a bottom side 19D, a right side 19E, and a left side 19F. In the preferred embodiment, the non-conductive housing 19 is generally rectangular in shape and may have beveled edges and other protrusions. In one configuration, the housing is formed out of plastic and is about 1.1 inches×1.0 inches×1.5 inches and is configured to hold an "AA" sized battery. Of course in other configurations of the preferred embodiment, the non-conductive housing 19 can be bigger or smaller or other shaped to hold different sized batteries. Even though the housing assembly 20 is generally rectangular in shape, it can have a variety of other surfaces and openings. In the preferred embodiment, the housing assembly 20 has an upper tapered surface 48 and a lower tapered surface 49. It also has an upper somewhat protruding post mount 50 and a lower somewhat protruding post mount 51. Each post mount 40, 51 has a partial opening 52 extending partially into it. The housing assembly 20 also has a partial cutout area 53 between its top side 19C and left side 19F. An opening 54 is also formed between the top side 19C and the right side 19E that is used in mounting contact clip 21A. Another recessed area/opening 55 is formed generally near the intersection of the right wall 19E and back wall 19B The housing 19 can have battery contacts 21A, 21B mounted on it that make electrical contact with the terminals of the battery 2. For example, the contacts 21A, 21B can be standard clip type contacts that have burrs 47 that are snap-fitted to the housing 19. In the preferred embodiment, contact 21A can engage the metallic can 3 that is connected to the spring 13 that makes contact with the negative terminal of the battery 2 while contact 21B contacts the positive terminal of the battery 2 when it is inserted into the battery housing assembly 20. A protective cover 23 can also be placed around the housing 19.

For example and as illustrated in FIG. 2B a protective cover 23 can be formed out of sheet aluminum so that it wraps around at least four sides of the non-conductive housing 19. In the preferred embodiment, the cover 23 has a top side 23A, a bottom side 23B, a right side 23C and a back side 23D. An overlapped portion 57 of the back side 23D is bent at about 90 degrees and overlaps the top side 23A. The cover has two holes 58 through which two screws 59 can pass. The screws 59 can be screwed into openings 52 in the battery housing assembly 19 to attach the protective cover 23 to the battery housing assembly 19.

Those skilled in the art will appreciate that the present invention provides a battery mount that requires only a small installed space and no tools to remove and replace a battery in it. Additionally, a battery within it can be replaced while wearing gloves or not wearing gloves. It will also be appreciated that the battery return is also isolated from a chassis ground that grounds the electronics module.

Having described the components of the preferred embodiment of a sample battery holder, example methods of how it is used are now described with reference to a method of its use. The method may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
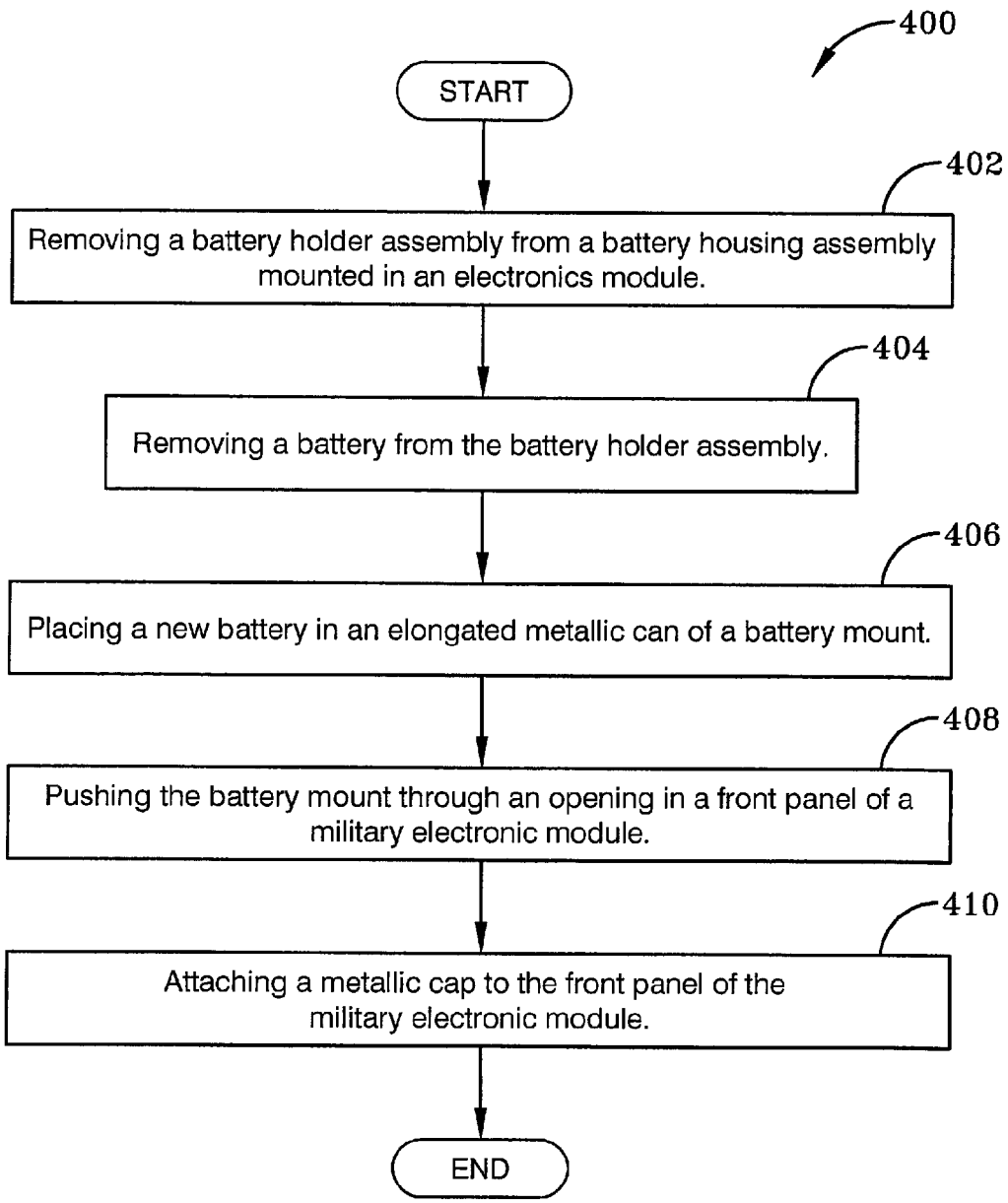
FIG. 4 illustrates an embodiment of a method of installing a battery in a military electronics module mounted in a military electronic chassis. Similar numbers refer to similar parts throughout the drawings.

FIG. 4 illustrates a method 400 of installing a battery in a military electronics module mounted in a military electronic chassis. The method 400 begins, at 402, by removing a battery holder assembly from a battery housing assembly mounted in the electronics module and then removing an old battery from the battery holder assembly, at 404. Next, the method 400 places, at 406, a new battery in an elongated metallic can portion of the battery holder assembly. The metallic can is at least partially surrounded by an insulator sleeve that electrically isolates battery terminals of the battery form a ground of the electronic chassis.

The method 400 now begins to reinstall the battery holder assembly by pushing the battery holder assembly through an opening in a front panel of the military electronics module. A metallic cap connected to the insulator sleeve is attached to the front panel of the military electronics module, at 410. For example, the metallic cap external threads can be rotated to screw it onto complimentary female threads in an extended boss located on the front panel of the military electronics module. Optionally, an O-ring can be placed between the metallic extended boss of the front panel of the military electronics module to provide for a water tight connection. The metallic cap provides EMI shielding to military electronics module. This method 400 can be performed without using any tools and can be performed while wearing or not wearing gloves.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A battery mount comprising:
    an elongated battery can with a first end and a second end configured to receive a battery through the second end;
    an insulating sleeve which fits around at least part of the elongated battery can;
    an insulating wall located adjacent the first end of the elongated battery can;
    a metallic cap extending from adjacent the first end of the elongated battery can away from the second end of the elongated battery can, wherein the insulating wall extends between the metallic cap and the elongated battery can to insulate the metallic cap from the elongated battery can;
    a non-conductive housing adapted to be mounted in an electronics module;
    wherein the elongated battery can and insulating sleeve are together insertable into and removable from the non-conductive housing; and
    wherein the metallic cap is configured to be removably attached to a front panel of the electronics module when the elongated battery can and the battery are installed in the non-conductive housing.

2. The battery mount of claim 1 wherein the insulating sleeve and the non-conductive housing isolates the ground of the battery from the electronics module, and wherein the metallic cap provides for electromagnetic shielding of the battery.

3. The battery mount of claim 1 further comprising:
    a solid sealing ring located between the metallic cap and the front panel when the metallic cap is attached to the front panel and configured to provide a water tight connection between the metallic cap and the front panel.

4. The battery mount of claim 1 further comprising:
    threads formed in the metallic cap configured to thread onto complementary threads on the front panel.

5. The battery mount of claim 1 wherein the metallic cap further comprises:
    a lanyard connected to the metallic cap and configured to be connected to the front panel of the electronics module to prevent the loss of the metallic cap.

6. The battery mount of claim 1 further comprising:
    a contact spring located inside the elongated battery can adjacent the first end of the elongated battery can and configured to make electrical contact with one end of the battery.

7. The battery mount of claim 1 further comprising:
    a first metallic clip mounted on the non-conductive housing configured to make contact with a negative terminal of the battery through the elongated battery can; and
    a second metallic clip mounted on the non-conductive housing configured to make contact with a positive terminal of the battery.

8. The battery mount of claim 1 wherein the elongated battery can is formed out of a metal.

9. The battery mount of claim 1 wherein the elongated battery can and the insulating sleeve are cylindrically shaped.

10. The battery mount of claim 1 wherein the elongated battery can is configured to receive about 75% of the battery when the battery is fully inserted into the elongated battery can.

11. The battery mount of claim 1 wherein metallic cap is machined brass and is tin plated.

12. A combination of a battery mount and an electronics module having a front panel, the battery mount comprising:
    a metallic can configured to receive a battery;
    an insulating sleeve covering part of the metallic can;
    a metallic cap connected to the insulating sleeve and removably attachable to the electronics module adjacent the front panel of the electronics module when the battery is installed in the electronics module;
    a battery contact inside the electronics module and adapted to be engaged by a battery terminal of the battery;
    wherein the metallic can and insulating sleeve are together insertable into and removable from the electronics module;
    wherein the metallic cap, metallic can and insulating sleeve move together as a unit toward the battery contact during insertion of the battery can and insulating sleeve into the electronics module and as a unit away from the battery contact during removal of the battery can and insulating sleeve from the electronics module;
    wherein the insulating sleeve and metallic can are configured to isolate positive and negative terminals of the battery from a surface of the electronics module when the battery is in the battery can and the battery can and insulating sleeve are in the electronics module; and wherein the metallic cap provides electromagnetic interference shielding to electronic devices in the electronics module.

13. A method comprising the steps of:
providing a electronics module and a first electrical contact inside the electronics module;
providing a battery holder assembly comprising an elongated metallic can, an insulator sleeve which at least partially surrounds the elongated metallic can, and a metallic cap;
providing a battery having positive and negative terminals;
placing the battery in the elongated metallic can; and
while the battery is in the elongated metallic can, pushing the battery holder assembly including the elongated metallic can, insulator sleeve and metallic cap as a unit from a first position in which the battery holder assembly is outside the electronics module through an opening in a front panel of the electronics module to a second position in which the elongated metallic can and insulating sleeve are inside the electronics module so that one of the terminals of the battery which is out of contact with the first electrical contact in the first position comes into contact with the first electrical contact in the second position;
wherein when the battery holder assembly is in the second position, the metallic cap provides electromagnetic interference shielding to the electronics module and the insulator sleeve isolates the positive and negative terminals of the battery from a surface of the electronics module.

14. The method of claim 13 further comprising:
rotating the metallic cap to screw the metallic cap onto a threaded battery mount protrusion forward of the front panel of the electronics module; and
wherein the step of pushing comprises pushing the elongated metallic can and insulating sleeve through the battery mount protrusion into the electronics module.

15. The method of claim 14 further comprising:
placing an O-ring between the metallic cap and the threaded battery mount protrusion to provide a water tight connection.

16. The method of claim 13 wherein the step of pushing the battery holder assembly through the opening further comprises pushing the battery holder assembly into a non-conductive housing that is mounted within the electronics module and on which the first electrical contact is mounted.

17. The battery mount of claim 1 wherein the metallic cap, insulating wall, elongated battery can and insulating sleeve move together as a unit during insertion of the elongated battery can and insulating sleeve into the non-conductive housing and during removal of the elongated battery can and insulating sleeve from the non-conductive housing.

18. The battery mount of claim 1 further comprising
a first electric contact which is inside the elongated battery can adjacent the first end of the elongated battery can and adapted to contact a first terminal of the battery when the battery is in the elongated battery can; and
a second electric contact which is outside the elongated battery can so that the second end of the elongated battery can is between the first contact and the second contact when the elongated battery can is installed in the non-conductive housing, wherein the second electric contact is adapted to contact a second terminal of the battery when the battery is in the elongated battery can and the elongated battery can is installed in the non-conductive housing.

19. The battery mount of claim 1 in combination with the battery; and wherein the battery mount further comprises first and second electrical contacts mounted on the non-conductive housing;
the first electrical contact engages the elongated battery can when the elongated battery can is within the non-conductive housing;
the first electrical contact is out of contact with the elongated battery can when the elongated battery can is removed from the non-conductive housing;
the second electrical contact engages a terminal of the battery when the battery is in the elongated battery can and the elongated battery can is within the non-conductive housing; and
the second electrical contact is out of contact with the terminal of the battery when the battery is in the elongated battery can and the elongated battery can is removed from the non-conductive housing.

20. The battery mount of claim 12 in combination with the battery; wherein the metallic cap, metallic can, insulating sleeve and battery move together as a unit toward the battery contact during insertion of the battery can and insulating sleeve into the electronics module to move the battery terminal into engagement with the battery contact and as a unit away from the battery contact during removal of the battery can and insulating sleeve from the electronics module to move the battery terminal out of contact with the battery contact.

21. The combination of claim 12 wherein the electronics module comprises a battery mount protrusion forward of the front panel; the metallic cap is removably attached to the battery mount protrusion; and the metallic can and insulating sleeve are insertable through the battery mount protrusion into the electronics module.

22. The method of claim 13 further comprising the step of
providing a second electrical contact inside the electronics module which is out of contact with the elongated metallic can in the first position; and
wherein the step of pushing causes the elongated metallic can to come into contact with the second electrical contact so that the elongated metallic can is in contact with the second electrical contact in the second position.

* * * * *